US012796538B2

(12) United States Patent
Kaji et al.

(10) Patent No.: US 12,796,538 B2
(45) Date of Patent: Nov. 10, 2026

(54) SEMICONDUCTOR DEVICE AND METHOD FOR MANUFACTURING THE SAME

(71) Applicant: Mitsubishi Electric Corporation, Tokyo (JP)

(72) Inventors: Yusuke Kaji, Tokyo (JP); Hiroyuki Harada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 897 days.

(21) Appl. No.: 17/814,298

(22) Filed: Jul. 22, 2022

(65) Prior Publication Data

US 2023/0140664 A1 May 4, 2023

(30) Foreign Application Priority Data

Nov. 1, 2021 (JP) ................................ 2021-178538

(51) Int. Cl.
*H10W 90/00* (2026.01)
*H10W 40/25* (2026.01)
(Continued)

(52) U.S. Cl.
CPC ......... *H10W 90/00* (2026.01); *H10W 40/255* (2026.01); *H10W 74/111* (2026.01);
(Continued)

(58) Field of Classification Search
CPC ............. H01L 2224/4312; H01L 23/24; H01L 23/3135; H01L 23/142; H01L 2224/48992;
(Continued)

(56) References Cited

U.S. PATENT DOCUMENTS 5,759,874 A * 6/1998 Okawa .................... H10P 72/74 438/126
7,800,241 B2 * 9/2010 Bauer ................. H10W 70/411 257/E23.077
(Continued)

FOREIGN PATENT DOCUMENTS

CN 113206049 A 8/2021
JP 2006-351737 A 12/2006
(Continued)

OTHER PUBLICATIONS

Gelest, Inc. 2006, How Does a Silane Coupling Agent Work (Year: 2006).*
(Continued)

*Primary Examiner* — Dale E Page
*Assistant Examiner* — Genevieve G Bullard-Connor
(74) *Attorney, Agent, or Firm* — Studebaker Brackett PLLC

(57) ABSTRACT

The object is to provide a technology for enabling enhancement of the reliability of a semiconductor device. The semiconductor device includes: a semiconductor element; a piece of linear wire connected to an upper surface of the semiconductor element; a coating material in contact with the semiconductor element, and the piece of wire in an upper region on the semiconductor element; and a sealant protecting the semiconductor element, the piece of wire, and the coating material, wherein the coating material contains substances with covalent bonds between oxygen and each of silicon and a metal, a silicon oxide, and siloxane.

6 Claims, 2 Drawing Sheets

(51) Int. Cl.
*H10W 72/00* (2026.01)
*H10W 74/10* (2026.01)
*H10W 76/136* (2026.01)

(52) U.S. Cl.
CPC .... *H10W 76/136* (2026.01); *H10W 72/01515* (2026.01); *H10W 72/07553* (2026.01); *H10W 72/884* (2026.01); *H10W 90/734* (2026.01); *H10W 90/754* (2026.01); *H10W 90/755* (2026.01)

(58) Field of Classification Search
CPC ......... H10W 40/255; H10W 72/01515; H10W 72/07553; H10W 72/884; H10W 74/111; H10W 76/136; H10W 90/00; H10W 90/734; H10W 90/754; H10W 90/755
See application file for complete search history.

(56) References Cited

U.S. PATENT DOCUMENTS

| | | | | |
|---|---|---|---|---|
| 2008/0223255 | A1* | 9/2008 | Gonzalez | C08G 59/1477 106/287.16 |
| 2011/0089549 | A1* | 4/2011 | Zenbutsu | H10W 70/40 257/E23.116 |
| 2014/0327018 | A1* | 11/2014 | Tatsumi | H10W 72/015 257/77 |
| 2021/0242133 | A1* | 8/2021 | Shibata | H10W 20/4405 |
| 2022/0267520 | A1* | 8/2022 | Hwang | C09D 179/08 |
| 2024/0170357 | A1* | 5/2024 | Shah | B29C 45/14639 |

FOREIGN PATENT DOCUMENTS

| | | | |
|---|---|---|---|
| JP | 2010-521552 | A | 6/2010 |
| WO | 95/12895 | A1 | 5/1995 |
| WO | 2009/045558 | A2 | 4/2009 |
| WO | 2021/117548 | A1 | 6/2021 |

OTHER PUBLICATIONS

P.G. Pape, 29—Adhesion Promoters: Silane Coupling Agents M. Kutz (Ed.), Appl. Plast. Eng. Handb., William Andrew Publishing, Oxford (2011), pp. 503-517, 10.1016/B978-1-4377-3514-7.10029-7 (Year: 2011).*
"Decision of Refusal" Office Action issued in JP 2021-178538; mailed by the Japanese Patent Office on Dec. 10, 2024.
An Office Action; "Notice of Reasons for Refusal," mailed by the Japanese Patent Office on Sep. 3, 2024, which corresponds to Japanese Patent Application No. 2021-178538 and is related to U.S. Appl. No. 17/814,298; with English language translation.
An Office Action mailed by the German Patent and Trade Mark Office on Jun. 26, 2024, which corresponds to German Patent Application No. DE 102022119428.0.
Office Action issued in CN 202211328971.X; mailed by the State Intellectual Property Office of the People's Republic of China on Jun. 30, 2026.

* cited by examiner

SEMICONDUCTOR DEVICE AND METHOD FOR MANUFACTURING THE SAME

FIELD OF THE INVENTION

The present disclosure relates to a semiconductor device and a method for manufacturing the same.

DESCRIPTION OF THE BACKGROUND ART

Structures that coat, for example, semiconductor elements with a coating material such as polyimide and protect the semiconductor elements for enhancing the reliability of semiconductor devices have been proposed (e.g., Japanese Patent Application Laid-Open No. 2006-351737). Furthermore, resins each with at least one pendent group comprising a —Si(OR)$_3$ group for promoting adhesion have been proposed (e.g., Japanese Unexamined Patent Application Publication No. 2010-521552).

Typically, when a coating material reacts with energy such as heat, light, or plasma, not only an intended reactant but also a byproduct different from the reactant are produced. This is because a composition of the reacted coating material differs from a composition of the unreacted coating material. Consequently, even if a composition is designated before the reaction, intended adhesion and reliability cannot be obtained in some cases, depending on a proportion of the byproduct to the whole after the reaction. Thus, there is room for improvement in improving the adhesion and reliability of coating materials.

Conventionally, applying a coating to semiconductor elements that generate a large amount of heat in a semiconductor device promotes the adhesion between the semiconductor elements and a sealant to enhance the reliability of the semiconductor device. Even though pieces of wire with diameters ranging from several tens to several hundred μm are very thin, the heat given to the pieces of linear wires to be connected to semiconductor elements is as relatively high as the heat given to the semiconductor elements. Thus, the pieces of wire tend to have a problem of a rupture.

SUMMARY

The present disclosure has been made in view of the problem, and has an object of providing a technology for enabling enhancement of the reliability of a semiconductor device.

The semiconductor device according to the present disclosure includes: a semiconductor element; a piece of linear wire connected to an upper surface of the semiconductor element; a coating material in contact with the semiconductor element, and the piece of wire in an upper region on the semiconductor element; and a sealant protecting the semiconductor element, the piece of wire, and the coating material. The coating material contains substances with covalent bonds between oxygen and each of silicon and a metal, a silicon oxide, and siloxane.

This structure can enhance the reliability of the semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
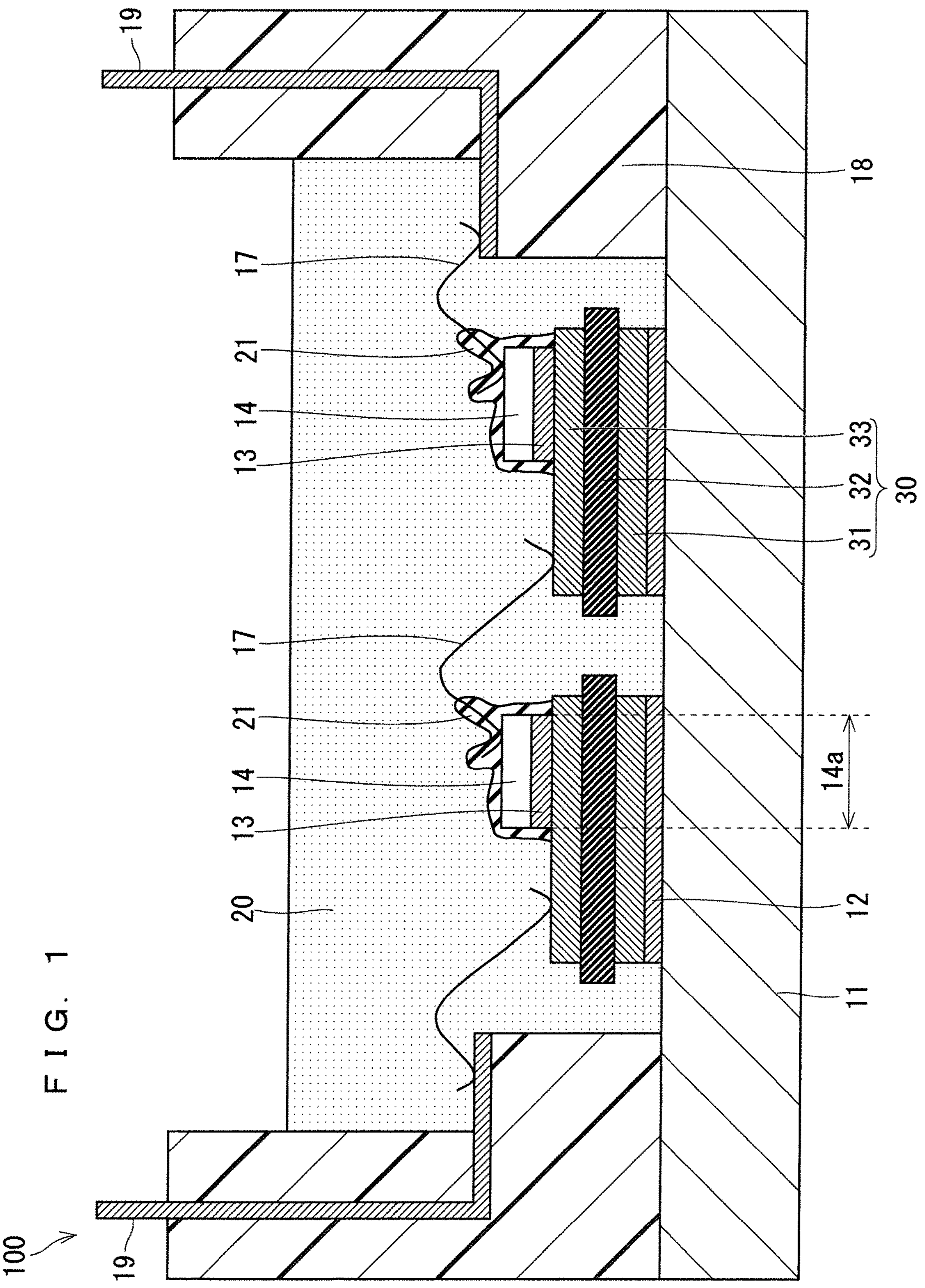
FIG. 1 is a cross-sectional view illustrating a structure of a semiconductor device according to Preferred Embodiment 1.

Embodiments will be hereinafter described with reference to the attached drawings. The features to be described in embodiments below are mere exemplification, and all of the features are not necessarily essential. In the description below, identical constituent elements in a plurality of embodiments will be denoted by the same or similar reference numerals, and the different constituent elements will be mainly described. In the following description, a particular position and a particular direction such as “up”, “down”, “left”, “right”, “front”, or “back” need not always coincide with an actual position and an actual direction.

Preferred Embodiment 1

FIG. 1 is a cross-sectional view illustrating a structure of a semiconductor device 100 according to Preferred Embodiment 1. The semiconductor device 100 in FIG. 1 includes a base plate 11, bonding components 12 and 13, semiconductor elements 14, pieces of wire 17, a casing 18, a sealant 20, a coating material 21, and insulating substrates 30.

Each of the insulating substrates 30 includes an insulating layer 32, a conductor 31 disposed on the insulating layer 32, and a conductive circuit 33 disposed on the insulating layer 32 on the opposite side of the conductor 31.

The insulating layer 32 may be, but not exclusively, made of an inorganic ceramic material such as alumina ($Al_2O_3$), aluminum nitride (AlN), silicon nitride ($Si_3N_4$), silicon dioxide ($SiO_2$), or boron nitride (BN). The insulating layer 32 may be made of a resin in which at least one impalpable particle or filler is dispersed. The at least one impalpable particle or filler may be made of, for example, an inorganic ceramic material such as alumina ($Al_2O_3$), aluminum nitride (AlN), silicon nitride ($Si_3N_4$), silicon dioxide ($SiO_2$), boron nitride (BN), diamond (C), silicon carbide (SiC), or boron oxide ($B_2O_3$), or a resin such as a silicone resin or an acrylic resin. The resin in which at least one impalpable particle or filler is dispersed may be, but not exclusively, any resin with electrical insulating properties, for example, an epoxy resin, a polyimide resin, a silicone resin, or an acrylic resin.

The conductor 31 and the conductive circuit 33 may be, but not exclusively, made of a metal such as copper or aluminum. The conductor 31 and the conductive circuit 33 may be made of the same material or different materials. The number of the conductive circuits 33 may be one or two or more, and is determined, for example, according to the rated capacity and the wiring specification of the semiconductor device 100.

The base plate 11 is bonded to the conductors 31 of the insulating substrates 30 through the bonding components 12. The base plate 11 may be, but not exclusively, made of a metal such as copper, aluminum, or a copper-molybdenum alloy (CuMo), or a composite material such as a silicon carbide-aluminum composite (AlSiC) or a silicon carbide-magnesium composite (MgSiC). The base plate 11 may be made of an organic material such as an epoxy resin, a polyimide resin, an acrylic resin, or polyphenylene sulfide (PPS) resin. The bonding components 12 may be, but not exclusively, any bonding components, and made of, for example, solder.

Each of the semiconductor elements 14 is bonded to the conductive circuit 33 of the insulating substrate 30 through the bonding component 13. Specifically, the bonding component 13 is connected to the lower surface of the semiconductor element 14, and the conductive circuit 33, the insulating layer 32, and the conductor 31 are connected to the lower surface of the semiconductor element 14 through the bonding component 13 in this order.

Examples of the semiconductor elements 14 may include an insulated-gate bipolar transistor (IGBT), a metal oxide semiconductor field effect transistor (MOSFET), a PN junction diode (PND), a Schottky barrier diode (SBD), and a freewheeling diode (FWD). The semiconductor element 14 may be, but not exclusively, made of normal silicon (Si), or a wide bandgap semiconductor such as silicon carbide (SiC), gallium nitride (GaN), or diamond. The semiconductor element 14 made of a wide bandgap semiconductor enables stable operations at high temperatures and high voltages and faster switching in the semiconductor device 100. The bonding components 13 may be, but not exclusively, any bonding components. The bonding components 12 and 13 may be made of the same material or different materials.

The number of each of the insulating substrates 30 and the semiconductor elements 14 may be one or two or more, and is determined, for example, according to the rated capacity and the wiring specification of the semiconductor device 100. The number of the bonding components 12 and the number of the bonding components 13 are determined by the number of the insulating substrates 30 and the number of the semiconductor elements 14, respectively.

The casing 18 surrounds the semiconductor elements 14 and the pieces of wire 17, and exposes surfaces of the base plate 11 which are opposite to the semiconductor elements 14. The casing 18 may be, but not exclusively, made of any material with electrical insulating properties, for example, an epoxy resin, a polyimide resin, an acrylic resin, or polyphenylene sulfide (PPS) resin.

Terminals 19 are embedded in the casing 18 with one end of each of the terminals 19 being exposed. The terminals 19 may be made of a material identical to or different from that of the conductive circuit 33.

One end of the piece of linear wire 17 is connected to the upper surface of the semiconductor element 14. The other end of the piece of wire 17 is connected to, for example, the conductive circuit 33 of the insulating substrate 30, or the terminal 19. The pieces of wire 17 are made of a conductive material such as copper or aluminum. The diameter of the piece of wire 17 ranges, for example, from several tens to several hundred μm.

The sealant 20 protects the semiconductor elements 14, the pieces of wire 17, and the coating material 21. The sealant 20 may be made of an insulating resin such as an epoxy resin, a silicone resin, polyurethane, a polyimide resin, a polyamide resin, or an acrylic resin. The epoxy resin is an epoxy material, and the silicone resin is silicone gel. The sealant 20 may be made of an insulating resin in which particles or fillers for improving the strength and the thermal conductivity are dispersed. The particles or fillers may be made of, for example, an inorganic ceramic material such as alumina ($Al_2O_3$), aluminum nitride (AN), silicon nitride ($Si_3N_4$ silicon dioxide ($SiO_2$), boron nitride (BN), diamond (C), silicon carbide (SiC), or boron oxide ($B_2O_3$).

The coating material 21 is in contact with the semiconductor elements 14, and the pieces of wire 17 in upper regions 14*a* on the semiconductor elements 14. The coating material 21 is further in contact with the bonding components 13 and the conductive circuits 33 according to Embodiment 1.

The coating material 21 is made of a silane coupling agent with a —$Si(OR)_x$ group before reaction. R should denote a hydrocarbon group, and x should denote any one of 1 to 3. The number of carbons in the hydrocarbon group should range from 1 to 10. A functional group to be connected to Si may be, for example, an epoxy group, an amino group, a vinyl group, a styryl group, a methacryl group, an acrylic group, a mercapto group, isocyanate, isocyanurate, or an acid anhydride.

When energy such as heat or light is given to the silane coupling agent of the coating material 21, a reaction occurs in which the silane coupling agent is converted into substances with —Si—O-M covalent bonds (M denotes a metal), a silicon oxide, and siloxane. Thus, the resulting coating material 21 of the semiconductor device 100 contains substances with covalent bonds between oxygen and each of silicon and the metal, the silicon oxide, and siloxane. Among these, the substances with covalent bonds influence the adhesion between the coating material 21 and the constituent elements that are in contact with the coating material 21. Moreover, the silicon oxide and siloxane influence the wettability on the adherend.

The number of the substances with covalent bonds in the coating material 21 should be higher than or equal to 0.1% of the number of silicon atoms in the coating material 21. When the number of the substances with covalent bonds that contribute to the adhesion is higher than or equal to 0.1% of the number of silicon atoms, the substances with covalent bonds can achieve adhesion higher than those of a structure using the coating material 21 in another numerical range and a structure without the coating material 21. Here, the number of silicon atoms in the coating material 21 can be measured using, for example, Time-of-Flight Secondary Ion Mass Spectrometry (TOF-SIMS).

The coating material 21 is a relatively thin film, and should have a thickness ranging from 10 nm to 100 μm. If the coating material 21 is thinner than 10 nm, a thinner portion of the coating material 21 or a portion without the coating material 21 will remain in the semiconductor device 100. Thus, the reliability of the semiconductor device 100 may decrease from the portion. If the coating material 21 is thicker than 100 μm, the reaction of the coating material 21 triggered by the given energy does not sufficiently proceed, and the coating material 21 may not be able to possess adequate strength. Thus, the coating material 21 preferably has a thickness more than or equal to 10 nm but not more than 100 μm, and more preferably has a thickness more than or equal to 10 nm but not more than 1 μm.

The coating material 21 serves a role in promoting the adhesion, for example, between the semiconductor elements 14 and the sealant 20. The coating material 21 with adhesion strength greater than the stress arising from the heat generated when the semiconductor elements 14 operate can prevent deterioration of the semiconductor device 100. In Embodiment 1, the coating material 21 is applied to the upper surfaces of the semiconductor elements 14, and the upper surfaces of the semiconductor elements 14 are connected to the pieces of wire 17. Typically, the piece of wire 17 with a diameter ranging from several tens to several hundred μm is thin. In addition to this, the stress caused by expansion of the materials of the semiconductor elements 14 and the pieces of wire 17 which generate heat causes the material of the pieces of wire 17 to easily deteriorate. In contrast, since the coating material 21 is in contact with not only the semiconductor elements 14 but also the pieces of wire 17 in Embodiment 1, the reliability of the semiconductor device 100 can be enhanced.

The coating material 21 need not be applied to the entirety of the pieces of wire 17. As long as the coating material 21 is in contact with a portion of the pieces of wire 17 subjected to the heat generated when the semiconductor elements 14 operate, for example, a portion of the pieces of wire 17 in the upper regions 14*a* on the semiconductor elements 14, the improvement in reliability of the semiconductor device 100 is expected.

The coating material 21 may further contain carbon atoms, and a percentage of the number of atoms by which the carbon atoms occupies in the coating material 21 may be 50% or less. Since this structure is obtained as a result of the reaction of the coating material 21 which has proceeded at least to some extent, the coating material 21 can produce at least some advantages.

The metal for covalent bonds may be a metal included in the coating material 21 before the reaction of the coating material 21, or at least one of a metal contained in the pieces of wire 17, a metal contained in the bonding components 13, and a metal contained in the conductive circuits 33. For example, when the metal for covalent bonds is the metal contained in the pieces of wire 17, the metal is capable of covalently bonding to the pieces of wire 17 itself. Thus, the adhesion of the coating material 21 can be further promoted.

In typical formation of the coating material 21, a reaction of a silane coupling agent proceeds by diluting the silane coupling agent using water or alcohol as a solvent to convert the —Si(OR)x group into a —$Si(OH)_x$ group. However, without adding a solvent containing water or alcohol to the chemical solution of the coating material 21, the reaction proceeds with moisture of the chemical solution itself, via the medium of water in the air, or by addition of high energy such as heat or light. Thus, adding the solvent is unnecessary. In view of this, the coating material 21 may be formed by applying the chemical solution of the coating material 21 to the semiconductor elements 14 and the pieces of wire 17, without adding the solvent containing water or alcohol to the chemical solution. Since such a manufacturing method can shorten the time for preparing a solution or the time required for the reaction, increase in the efficiency of manufacturing processes of the semiconductor device 100 can be expected.

[Modification]

Figure 2:
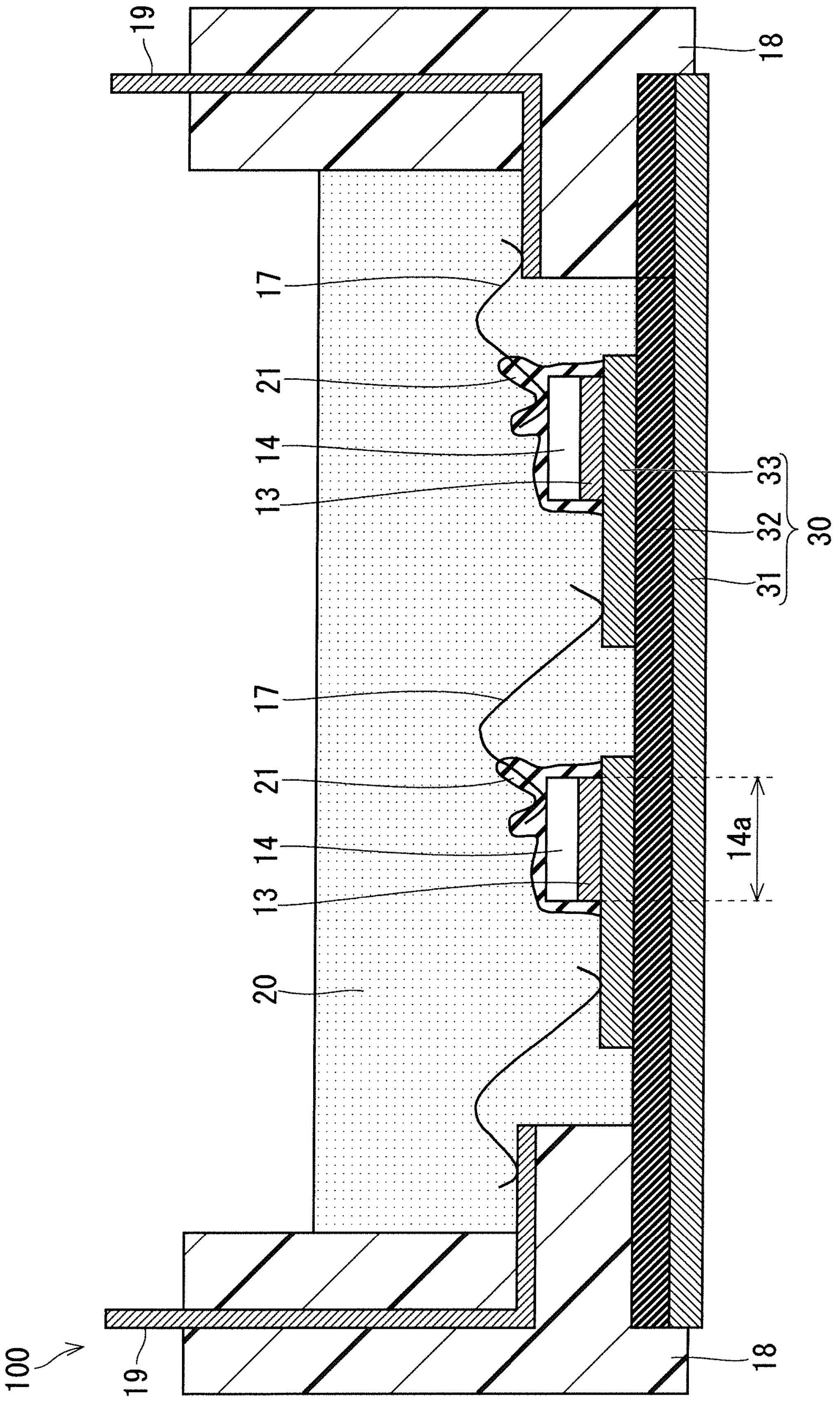
FIG. 2 is a cross-sectional view illustrating a structure of a semiconductor device according to a modification.

FIG. 2 is a cross-sectional view illustrating a structure of the semiconductor device 100 according to this modification. As illustrated in FIG. 2, the casing 18 may be formed with the conductor 31 being exposed, in the absence of the base plate 11. Since the conductor 31 serves as the base plate 11 in this structure, the cost of the device can be reduced.

The embodiments can be appropriately modified or omitted.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
- a semiconductor element;
- a piece of linear wire connected to an upper surface of the semiconductor element;
- a coating material in contact with the semiconductor element, and the piece of wire in an upper region on the semiconductor element;
- a sealant protecting the semiconductor element, the piece of wire, and the coating material,
- a bonding component connected to a lower surface of the semiconductor element; and
- a conductive circuit connected to the semiconductor element through the bonding component,
- wherein the coating material comprises a silicon oxide, siloxane, and substances with covalent bonds between oxygen and each of silicon and a metal, the metal being any metal present in the coating material, the piece of linear wire, the bonding component, or the conductive circuit,
- the number of the substances with covalent bonds between oxygen and each of silicon and a metal in the coating material is higher than or equal to 0.1% of the number of silicon atoms in the coating material,
- the coating material further contains carbon atoms, and
- the carbon atoms constitute 50% or less of all atoms of the coating material.

2. The semiconductor device according to claim 1,
- wherein the coating material is further in contact with the bonding component and the conductive circuit.

3. The semiconductor device according to claim 1, further comprising:
- an insulating layer, and a conductor, wherein the conductive circuit, the insulating layer, and the conductor are connected, in this order, to a lower surface of the semiconductor element through a bonding component; and
- a casing exposing the conductor and surrounding the semiconductor element and the piece of wire.

4. The semiconductor device according to claim 1,
- wherein the coating material has a thickness more than or equal to 10 nm but not more than 100 μm.

5. The semiconductor device according to claim 1,
- wherein the sealant contains an epoxy material or silicone gel.

6. A method for manufacturing the semiconductor device according to claim 1, comprising
- forming the coating material by applying a chemical solution of the coating material to the semiconductor element and the piece of wire, without adding a solvent containing water to the chemical solution and without adding a solvent containing alcohol to the chemical solution.

* * * * *